United States Patent [19]
Iannotti

[11] Patent Number: 5,808,852
[45] Date of Patent: Sep. 15, 1998

[54] CHAIN MAIL GROUND FOR ELECTROMAGNETIC TESTING PLATFORM

[75] Inventor: Joseph Alfred Iannotti, Amsterdam, N.Y.

[73] Assignee: EMI Holding Corp., Johnstown, N.Y.

[21] Appl. No.: 656,845

[22] Filed: May 30, 1996

[51] Int. Cl.⁶ .................................................. H01H 47/00
[52] U.S. Cl. .......................................................... 361/220
[58] Field of Search .................................... 361/212, 216, 361/219, 220, 231, 816, 818; 174/5 R, 5 SG, 6, 51

[56] References Cited

U.S. PATENT DOCUMENTS

| | | | |
|---|---|---|---|
| 457,327 | 8/1891 | Paget | 310/248 |
| 480,762 | 8/1892 | Cherry et al. | 310/227 |
| 519,188 | 5/1894 | Kersberg | 310/248 |
| 545,347 | 8/1895 | Coffin | 310/248 |
| 1,228,484 | 6/1917 | Schweitzer | 310/248 |
| 1,448,511 | 3/1923 | Becker | 310/248 |
| 1,962,041 | 6/1934 | Spong | 250/33 |
| 1,999,414 | 4/1935 | King | 175/264 |
| 2,524,163 | 10/1950 | Criss | 175/264 |
| 2,753,491 | 7/1956 | Legge | 361/214 |
| 4,712,062 | 12/1987 | Takamine | 324/158 F |
| 4,812,755 | 3/1989 | Toshiyuki et al. | 324/158 F |

*Primary Examiner*—Ronald W. Leja
*Attorney, Agent, or Firm*—Heslin & Rothenberg, P.C.

[57] ABSTRACT

A chain mail conductive meshing is conductively affixed to the perimeter of a platform to provide a broadband ground thereto. The chain mail is hung from the platform such that it contacts a ground plane therebelow. The platform is rotated during electromagnetic testing of equipment placed thereon, and the conductive meshing maintains the ground connection while the platform is rotated. A technique is disclosed for clamping the meshing to the platform, and alternate, sectional embodiments of the platform and meshing are provided.

29 Claims, 7 Drawing Sheets

CHAIN MAIL GROUND FOR ELECTROMAGNETIC TESTING PLATFORM

TECHNICAL FIELD

The present invention relates to a ground apparatus for a platform. More particularly, the present invention relates to a broadband ground apparatus for electromagnetic testing apparatus.

BACKGROUND OF THE INVENTION

Various electromagnetic interference test scenarios require the use of a metal platform or turntable which is flush mounted in a large continuous ground plane consisting of a sheet of metal or metallic screen. It is desirable for the table top to make continuous electrical contact with the ground plane along its perimeter and yet still be able to rotate.

There are several different types of turntable grounding schemes currently in use. The most prevalent is the use of a phosphor bronze brush attached to the circumference of the table. The brush is pointed outward and rubs against a permanent steel ring. One major problem associated with this type of grounding is that the brushes bind when the table changes direction. This results in a need for a large amount of torque to be available to overcome the binding, and thus the motors used in these turntable systems are larger and more costly than they would otherwise need to be. The excess friction also has a detrimental effect on the wear of the brushes as well as the table drive system itself.

To try to minimize this problem, some systems use discrete sections of brush placed at intervals along the table top circumference, but this method does not provide a continuous ground, which is a desirable feature.

Both brush-based schemes are difficult to set up properly due to the tight tolerances required. A slight misalignment can cause excessive torque to be placed on the motor and/or drastically decrease the life of the brushes.

Another requirement of turntable grounding is that the ground operate over a large spectrum of test frequencies, from DC to above 1 Ghz. Various types of point grounds have been disclosed in the prior art, but these point grounds are limited primarily to DC operation. It is important that the ground scheme maintain an effective broadband operating spectrum from DC to above 1 Ghz.

What is required, therefore, is a grounding scheme which eases the requirements of the driving motors of the turntables, eases the installation tolerances, and which operates effectively over a wide spectrum of test frequencies.

SUMMARY OF THE INVENTION

Briefly described, the invention in one aspect is an electromagnetic ground apparatus for a platform. Conductive meshing is conductively affixed about a perimeter of the platform, such that upon placement of the platform over a ground plane, the conductive meshing hangs from the perimeter of the platform. The hanging conductive meshing contacts the ground plane thereby providing a ground connection between the perimeter of the platform and the ground plane.

The invention includes an electromagnetic test apparatus having a platform, and including the electromagnetic ground apparatus described above affixed to the platform. The platform may be mounted in the testing apparatus to move over the ground plane such that upon movement of the platform over the ground plane, the conductive meshing maintains the ground connection between the perimeter of the platform and the ground plane. The platform may be circular and mounted to rotate about an axis thereof.

The conductive meshing is preferably collapsible in a vertical direction while hanging from the platform. Further, the conductive meshing in a preferred embodiment comprises chain mail.

The platform may comprise a plurality of sections in which case each of the sections would include a portion of the conductive meshing affixed to a perimeter thereof.

In a preferable embodiment of the invention, a clamp is provided for affixing the conductive meshing to a surface of the platform, a first portion of the conductive meshing being forcibly held between a surface of the clamp and the surface of the platform. An elongated member may be threaded through at least some links of a second portion of the conductive meshing, the elongated member thereby preventing slippage of the first portion of the meshing between the surface of the clamp and the surface of the platform.

In another aspect of the invention, the platform may be circular and comprise a planar upper surface. At least part of the ground plane may be a ring generally arranged about the perimeter of the platform, a first portion of the ring having a disk-like shape positioned below the perimeter of the platform for contacting the conductive meshing. The ring may have a second disk-like portion arranged coplanar with the planar upper surface of the platform and spaced closely to the perimeter thereof thereby facilitating movement of equipment under test between the planar upper surface of the platform and a surface of the second disk-like portion of the ring.

By providing conductive meshing, preferably chain mail, about the perimeter of a platform, a grounding scheme is provided which eases the requirements of the driving motors of the platform, eases the installation tolerances, and operates effectively over a wide-spectrum of test frequencies. Further features of the invention, and advantages thereof over prior systems, are discussed below.

DETAILED DESCRIPTION OF THE PREFERRED EMBODIMENT(S)

Figure 1:
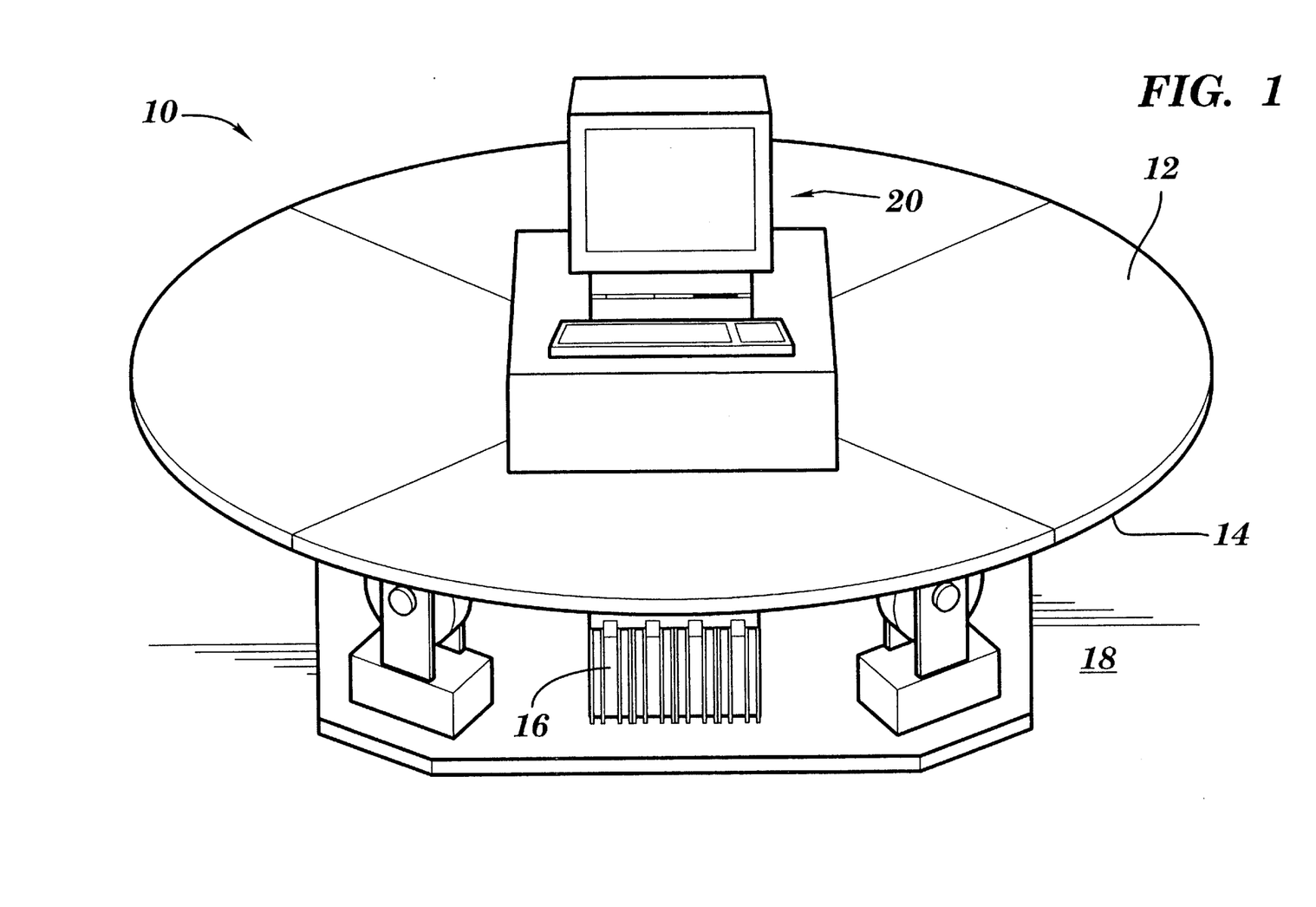
FIG. 1 depicts an electromagnetic test apparatus having a platform and equipment under test placed thereon.

With reference to FIG. 1, depicted therein is an electromagnetic test apparatus 10 with equipment under test 20 placed thereon. The electromagnetic test apparatus includes, in the exemplary embodiment shown, a circular platform 12, preferably fabricated from aluminum, the platform having a perimeter 14. To facilitate electromagnetic testing of the equipment under test 20, which usually involves the deployment of fixed antennas around the platform in order to obtain 360° of electromagnetic characteristic coverage, a support and drive mechanism 16 can be provided to rotate the platform and therefore the equipment under test.

As discussed above, it is desirable to emulate a large, continuous ground plane including platform 12. Because the surrounding subfloor 18 itself may form part of a viable ground plane, it is desirable to create a continuous ground plane, including the platform and the subfloor or other suitable environmental structure.

Figure 2:
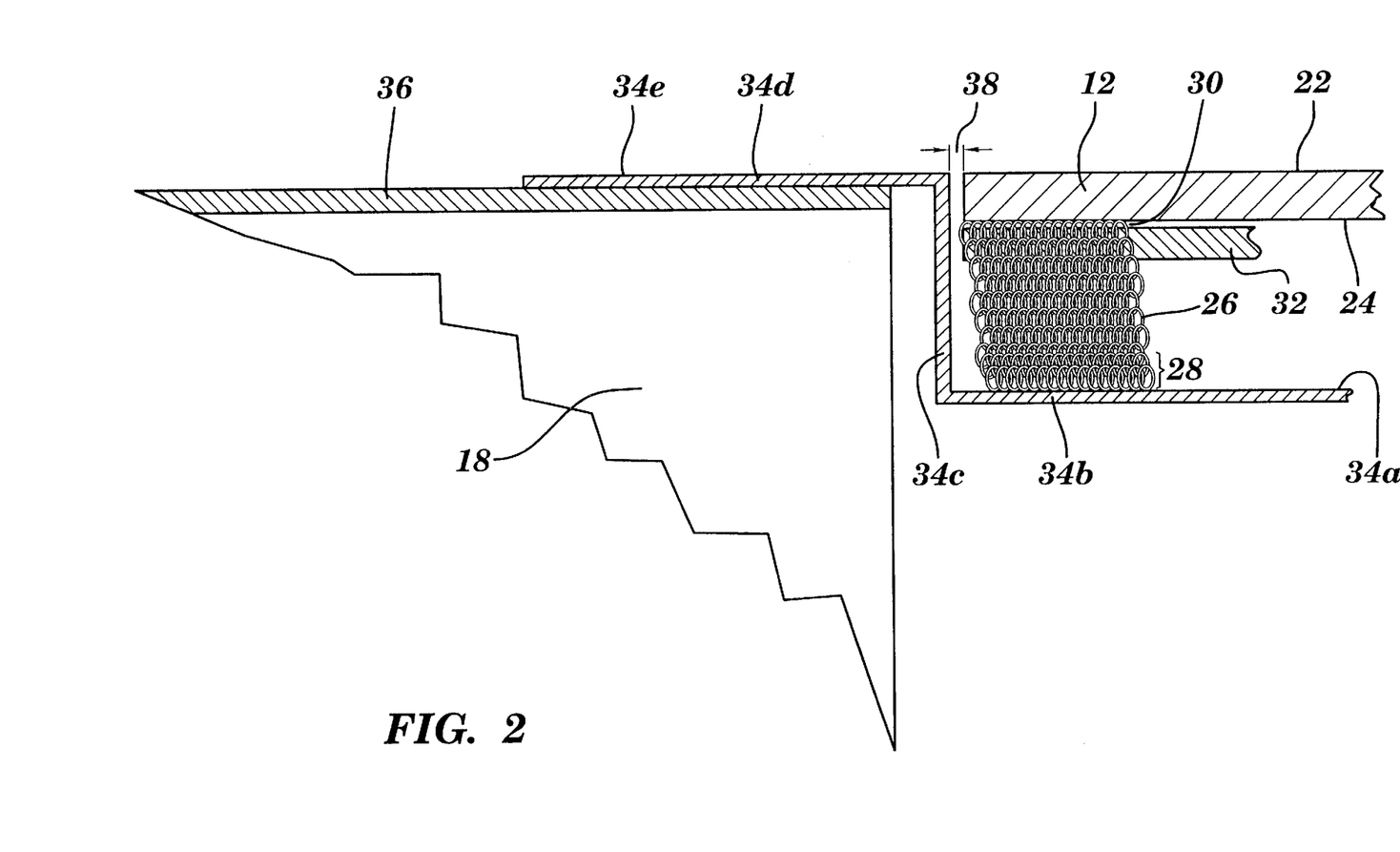
FIG. 2 is a side view of a portion of the platform of the electromagnetic test apparatus of FIG. 1 having affixed thereto a conductive meshing grounding apparatus pursuant to the principles of the present invention, and further depicts a sectional view of an exemplary ground plane.
Figure 6:
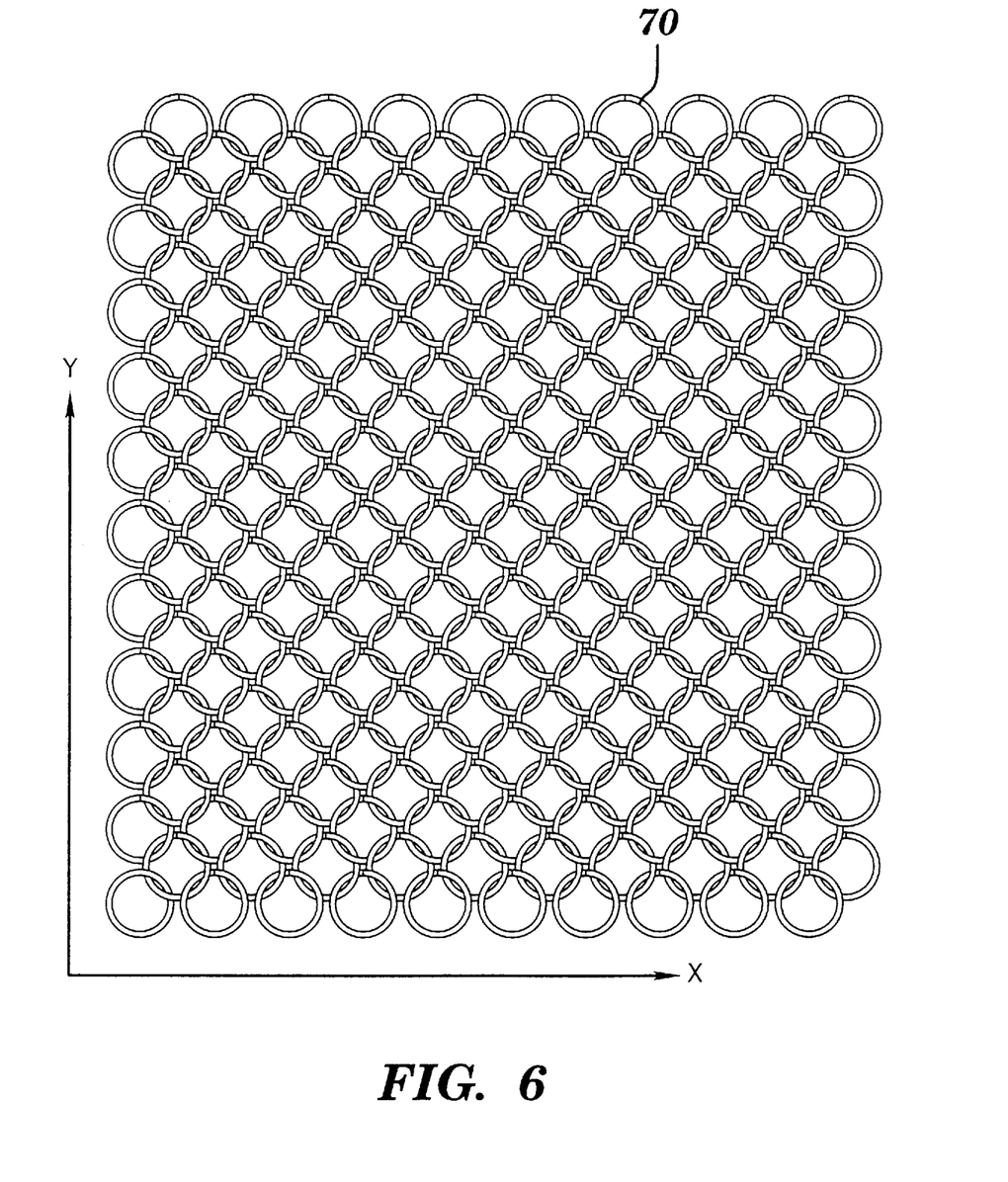
FIG. 6 depicts a sample portion of one type of chain mail meshing used pursuant to the principles of the present invention.

According to the principles of the present invention, with reference to FIG. 2, a collapsible conductive meshing 26 is hung from the underside 24 of the platform 12 about its perimeter to form an electromagnetic ground apparatus. (FIG. 2 is a side view of these elements.) The meshing creates a conductive, grounding connection between the perimeter of the platform 12 and a surface of the ground plane, 34a. In a preferred embodiment, a conductive clamp bar 32 is employed about the perimeter of the platform 12 to affix the upper portion 30 of the conductive meshing to the underside 24 of the platform 12. One important feature of a preferable type of conductive meshing used, in accordance with the principles of the present invention, is that the lower portion 28 thereof is readily collapsible such that no particular tolerance need be maintained between the lower planar surface 24 of the platform 12 and the surface of the ground plane 34a which contacts the conductive meshing 26. Chain mail is the preferred type of meshing and a section thereof is depicted in FIG. 6 and more fully described hereinafter. In a preferred embodiment, the chain mail is clamped to the underside of a round, metallic platform about its perimeter (i.e., about 0.25 inches in from the edge) and hangs approximately 3 inches below the platform in its installed, horizontal position. The hanging distance should be kept as short as possible.

The environmental ground plane depicted in FIG. 2 is an alternate arrangement of the subfloor ground plane depicted in FIG. 1. Either of these ground planes can be used with the ground apparatus of the present invention, as could any other type of suitable ground plane. In FIG. 2, an annular ring (shown in a cross-sectional view) comprising portions 34b, 34c and 34d is installed about the perimeter of the platform 12. One advantage to the annular ring structure depicted in FIG. 2 is that not only is the conductive connection made between platform 12 through contact of the conductive meshing 26 with surface 34a (which is conductively connected to a subfloor or other environmental ground plane 18 through a metal plane 36), but the coplanar surfaces 34e and 22 of the annular ring and the circular platform respectively allow for easy movement of equipment under test on and off platform 12. (Based on an examination of this cross-sectional view of the ring, those skilled in the art will recognize that the ring includes disc-like portions 34b and 34d, and a cylindrical portion 34c.)

In a preferred embodiment, the annular ring is fabricated from stainless steel, the platform is fabricated from aluminum and the clamp bar is also fabricated from aluminum. Further, the preferred embodiment of conductive meshing 26 is chain mail, fabricated from either stainless steel or aluminum.

One particular advantage of the grounding approach of FIG. 2 is that no particular tolerance need be maintained between platform 12 and ring 34 in space 38. If brushes were employed in this space to ground the platform, a tight tolerance would be required.

Figure 3:
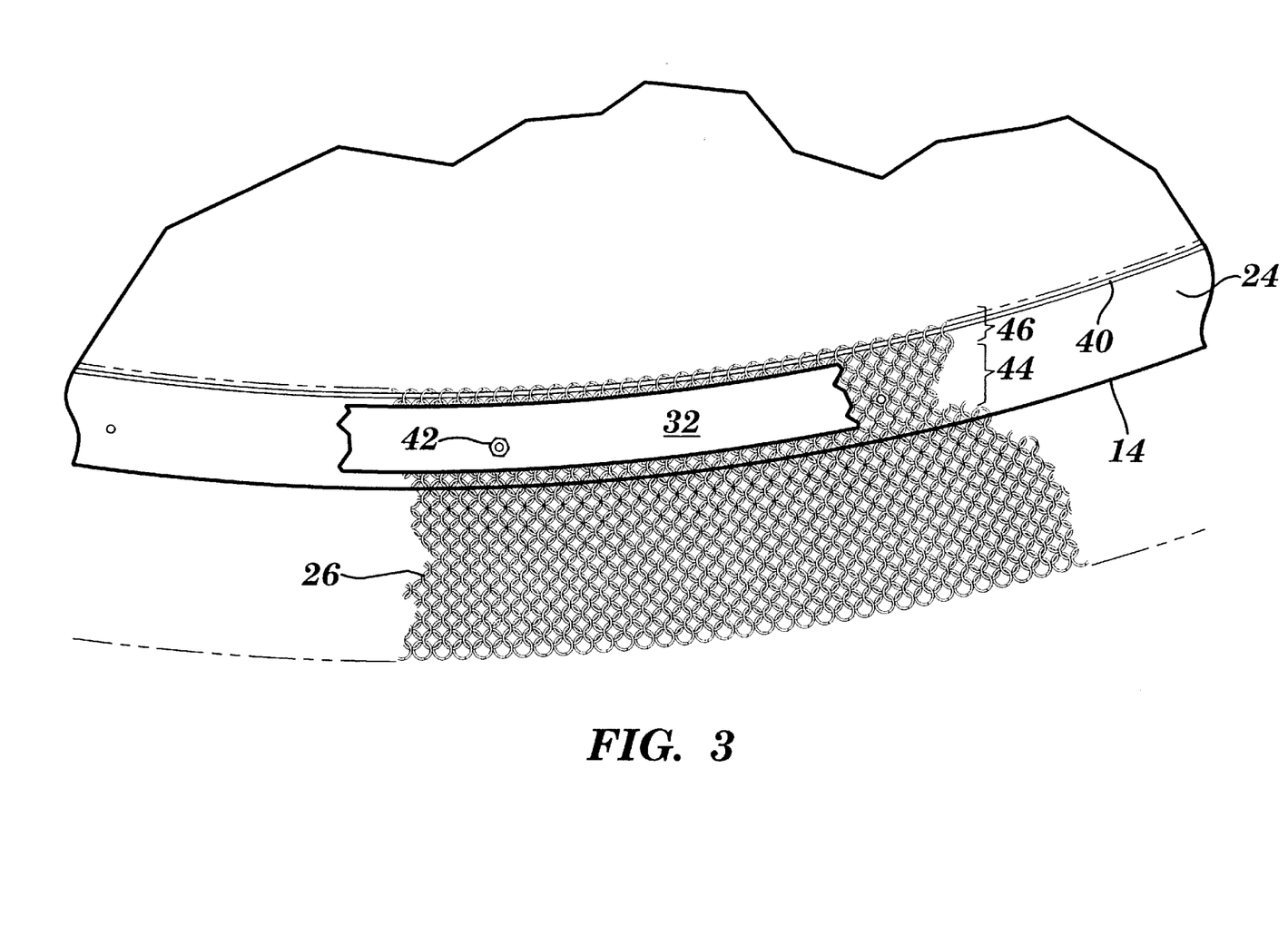
FIG. 3 depicts the lower planar surface of a portion of the platform and a preferred embodiment for affixing the conductive meshing to the platform.

FIG. 3 illustrates the underside or lower planar surface 24 of a portion of platform 12 and depicts additional detail of a preferred clamping scheme employed to affix conductive meshing 26 about the perimeter 14 of the platform. A generally flat, aluminum clamp bar 32 is employed and, via periodic bolts or screws 42, is positioned and thereby forcibly holds the portion 44 of the conductive meshing between itself and the lower planar surface 24 of the platform. If chain mail is employed as the conductive meshing, the links of the chain mail in portion 44 of the meshing 26 will generally lie flat between the clamp 32 and the lower planar surface 24.

Additional strength and durability can be attained by using an elongated member 40 threaded through the links in portion 46 of the chain mail conductive meshing 26. The elongated member can be provided of sufficient diameter thereby ensuring that the links in portion 46 do not lie flat and in fact are forced into their upright position. Maintaining the links in an upright position prevents slippage of the mesh 26 between clamp 32 and lower planar surface 24. Further, the diameter and placement of the elongated member itself, threaded through portion 46, further prevents slippage of the meshing 26 from its clamped position.

Figure 4:
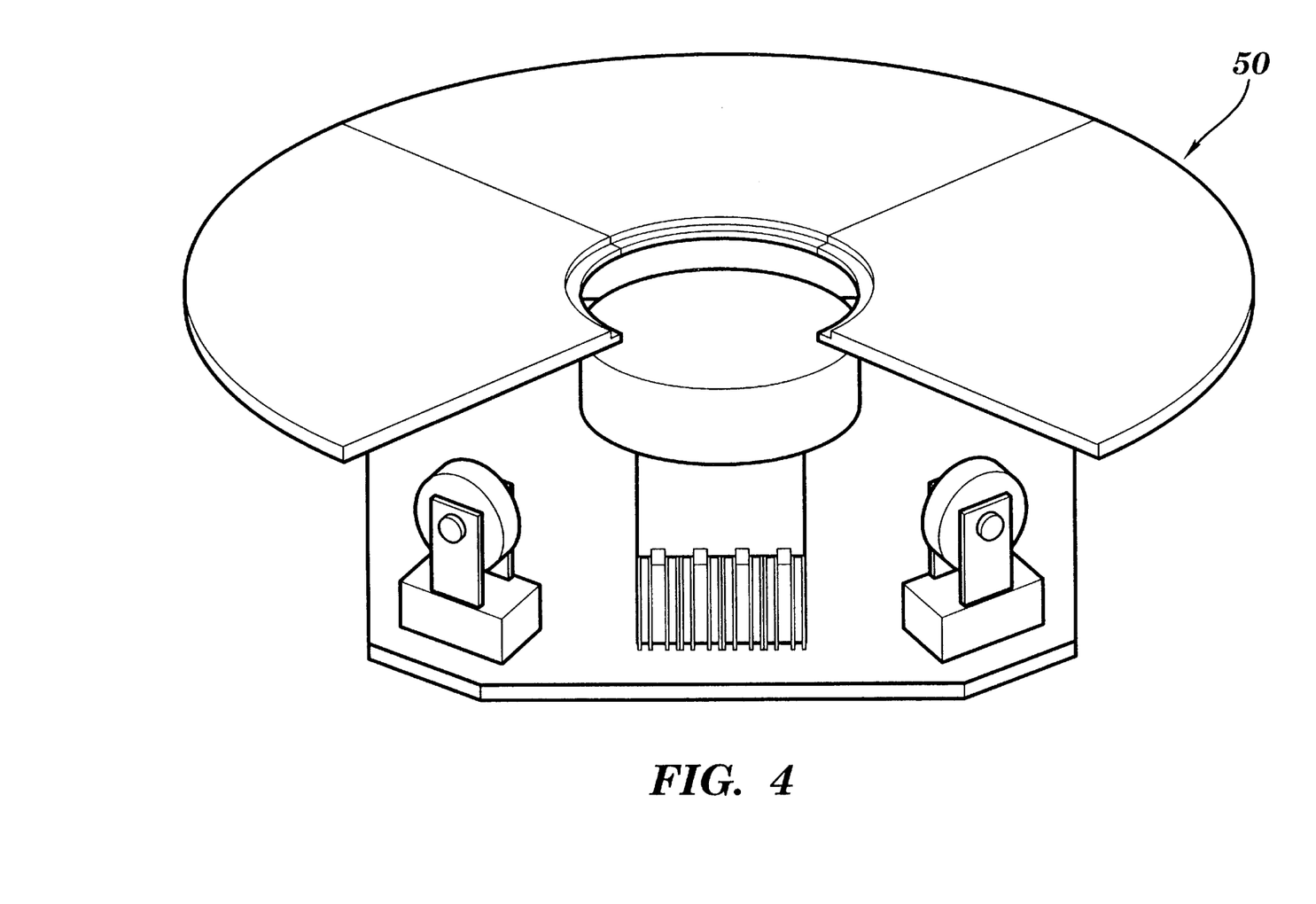
FIG. 4 depicts an electromagnetic test apparatus having a sectional platform.

In accordance with the principles of the present invention, the chain mail fabric can be affixed to substantially the entire perimeter, or the entire perimeter, of the platform. In certain embodiments of the platform, such as the one shown in FIG. 4, platform 50 may be fabricated in sections to be assembled at the point of installation. Platform 50 is shown in FIG. 4 with several such sections absent therefrom.

Figure 5:
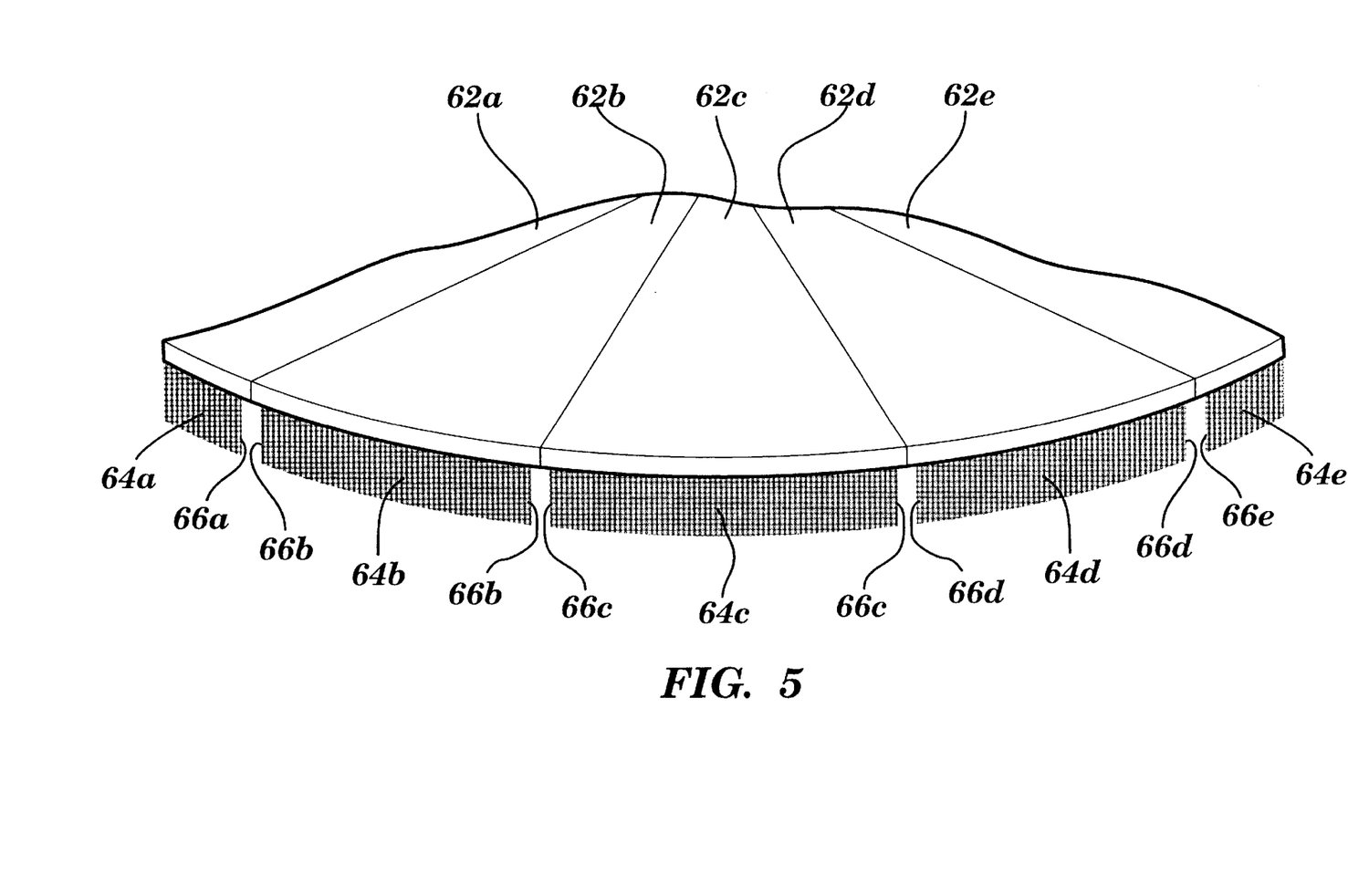
FIG. 5 depicts respective perimeter sections of the platform of FIG. 4 and respective portions of the conductive meshing connected thereto.

FIG. 5 illustrates one embodiment of these absent sections 62a–e. Each of these sections, in the circular embodiment of the platform, is a perimeter section because, in their final assembled form, they will form part of the perimeter of the full platform. Affixed to the perimeters of these perimeter sections are respective portions 64a–e of the conductive meshing. Once the sections 62 are assembled into the platform at the point of installation, portions 64 forming the conductive meshing will already be affixed and therefore hang from substantially the entire perimeter of the assembled platform. Though portions 64 are depicted in FIG. 5 having spaces therebetween, in other embodiments it may be preferable to overlap these portions such that at least some conduction occurs between adjacent portions. Further, in another embodiment, it may be desirable to physically connect the adjacent portions 64 along their edges 66 using wire or some other suitable form of lacing or clamping such that conduction occurs between adjacent portions of the conductive meshing.

It will be understood to those skilled in the art that a single continuous portion of conductive meshing can be employed about the entire perimeter of the platform if assembly and installation conditions permit.

FIG. 6 depicts a portion 70 of chain mail used for the conductive meshing in accordance with a preferred embodiment of the present invention. It will be evident from an examination of FIG. 6 that the chain mail is generally symmetrical in the x and y directions. This x–y symmetry maintains the same phase relationships in all directions, and therefore provides a particularly effective broadband ground for test frequencies of DC to 1 Ghz or more. A single point ground, or multiple point grounds, are not suitable for such broadband grounding because of the relationships required for effective grounding. In a preferred embodiment, ¼ inch diameter links are used for the chain mail. Generally, the diameter of the links of the chain mail should be less than 1/40th of the highest wavelength of expected test frequencies.

Other advantages of the chain mail are clearly evident in that it is collapsible. Thus, varying elevations across the platform will not affect the continuous contact between the bottom portion of the chain mail and the ground plane. Should an elevation decrease, the lower portion of the chain mail simply collapses, and a corresponding portion of the chain mail expands at a point on the platform where the elevation increases. Other types of fabric or brushes do not posses this property, and varying elevations would adversely corrupt the contour/shape and therefore the continuous contact.

Another particularly attractive advantage of the use of chain mail is that by merely hanging and dragging the chain mail along the ground plane, tolerances are loosened and, more importantly, the drive mechanism for the platform need not accommodate stiff brushes or other types of approaches. Further, reverse of rotation direction can be easily accomplished, without excess torque. Also, the chain mail is much more easily installed onto the perimeter of the platform than are other types of schemes, including brushes. Because of the lack of force required to maintain ground contact, the useful life of chain mail in the apparatus can be long. The only force creating the ground contact is gravity.

Figure 7:
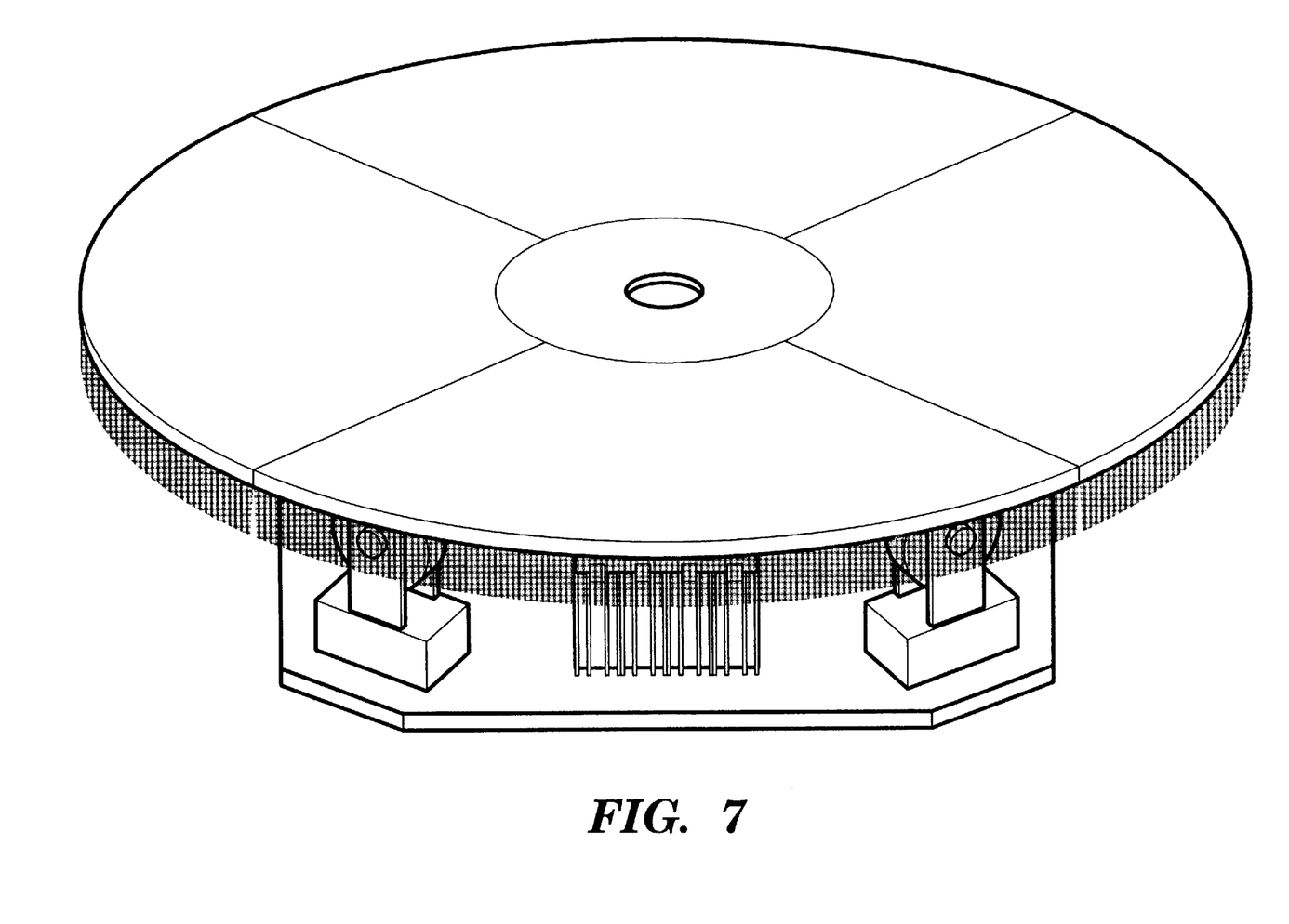
FIG. 7 depicts an electromagnetic test apparatus having chain mail meshing hanging therefrom pursuant to the principles of the present invention.

FIG. 7 is a perspective view of an electromagnetic test apparatus having the chain mail electromagnetic ground apparatus affixed thereto and hanging therefrom in accordance with the principles of the present invention.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. An apparatus, comprising:
    a platform; and
    conductive meshing conductively affixed about a perimeter of the platform, such that upon placement of the platform over a ground plane, the conductive meshing hangs from the perimeter of the platform and contacts the ground plane thereby providing a ground connection between the perimeter of the platform and the ground plane.

2. An electromagnetic testing apparatus, comprising:
    the apparatus of claim 1.

3. The electromagnetic testing apparatus of claim 2, wherein the platform is mounted in the testing apparatus to move over the ground plane such that upon movement of the platform over the ground plane, the conductive meshing maintains said ground connection between the perimeter of the platform and the ground plane.

4. The electromagnetic testing apparatus of claim 3, wherein the platform is circular and mounted to rotate about an axis thereof.

5. The electromagnetic testing apparatus of claim 2, wherein the conductive meshing is collapsible in a vertical direction while hanging from said platform.

6. The electromagnetic testing apparatus of claim 5, wherein the conductive meshing comprises chain mail.

7. The electromagnetic testing apparatus of claim 2, wherein the platform comprises a plurality of sections including at least some perimeter sections, and wherein the at least some perimeter sections have affixed thereto respective portions of the conductive meshing such that upon assembly of the plurality of sections into said platform, the conductive meshing comprising its respective portions is affixed about substantially the entire perimeter of the platform.

8. The electromagnetic testing apparatus of claim 7, wherein at least two adjacent portions of the conductive meshing are conductively affixed together.

9. The electromagnetic testing apparatus of claim 2, wherein the platform comprises a surface, and wherein the electromagnetic testing apparatus further comprises a clamp for affixing the conductive meshing to the surface of the platform, a first portion of the conductive meshing being forcibly held between a surface of the clamp and the surface of the platform.

10. The electromagnetic testing apparatus of claim 9, wherein the conductive meshing comprises chain mail, and wherein the electromagnetic testing apparatus further comprises an elongated member threaded through at least some links of a second portion of the chain mail, the second portion proximate the first portion but not held between the clamp and the platform, the elongated member thereby preventing slippage of the first portion of the chain mail between the surface of the clamp and the surface of the platform.

11. The electromagnetic testing apparatus of claim 10, wherein the links of the first portion of the chain mail lie in a flat position between the surface of the clamp and the surface of the platform, and wherein the elongate member is of sufficient thickness to hold at least some of the links of the second portion of the chain mail in an upright position.

12. The electromagnetic testing apparatus of claim 2, further comprising at least part of the ground plane, wherein a first portion of the at least part of the ground plane is positioned below the perimeter of the platform for contacting the conductive meshing.

13. The electromagnetic testing apparatus of claim 12, wherein the platform is circular and comprises a planar upper surface, and wherein the at least part of the ground plane comprises a ring generally arranged about the perimeter of the platform, a first portion of the ring having a disk-like shape, the ring having a second disk-like portion arranged coplanar with the planar upper surface of the platform and spaced closely to the perimeter thereof thereby facilitating movement of equipment under test between the planar upper surface of the platform and a surface of the second disk-like portion of the ring.

14. The electromagnetic ground apparatus of claim 1, wherein the conductive meshing is conductively affixed about substantially the entire perimeter of the platform.

15. The electromagnetic ground apparatus of claim 14, wherein the conductive meshing is conductively affixed about the entire perimeter of the platform.

16. A method for grounding, comprising:
    providing a platform; and
    hanging conductive meshing from a perimeter of the platform such that upon placement of the platform over a ground plane, the mesh hangs from the perimeter of the platform and contacts the ground plane thereby providing a ground connection between the perimeter of the platform and the ground plane.

17. A method for electromagnetically testing equipment with a platform mounted over a ground plane, comprising:
    grounding the platform according to the method of claim 16;

placing the equipment on the platform; and electromagnetically testing the equipment including moving the platform over the ground plane.

18. The method of claim 17, wherein the conductive meshing comprises chain mail.

19. The method of claim 17, wherein the platform is circular and said electromagnetically testing the equipment includes rotating the platform about an axis thereof.

20. The method of claim 16, wherein said hanging includes hanging the conductive meshing from substantially the entire perimeter of the platform.

21. An apparatus, comprising:

a platform;

conductive meshing; and means for hanging the conductive meshing from a perimeter of the platform such that upon placement of the platform over a ground plane, the mesh hangs from the perimeter of the platform and contacts the ground plane thereby providing a ground connection between the perimeter of the platform and the ground plane.

22. An apparatus for electromagnetically testing equipment, comprising:

the apparatus of claim 21; and means for electromagnetically testing the equipment including means for moving the platform over the ground plane.

23. The testing apparatus of claim 22 wherein the conductive meshing comprises chain mail.

24. The testing apparatus of claim 22, wherein the platform is circular and said means for electromagnetically testing the equipment includes means for rotating the platform about an axis thereof.

25. The apparatus of claim 21, wherein said means for hanging includes means for hanging the conductive meshing from substantially the entire perimeter of the platform.

26. An electromagnetic testing apparatus, comprising:

a circular platform, the platform mounted in said apparatus to rotate about an axis thereof; and conductive collapsible chain mail meshing affixed about substantially the entire perimeter of the platform and hanging therefrom, such that upon installation of the platform over a ground plane, the meshing contacts the ground plane thereby providing a ground connection to substantially the entire perimeter of the platform.

27. The electromagnetic testing apparatus of claim 26, wherein the circular platform has a planar upper surface, the testing apparatus further comprising:

a ring installed proximate the perimeter of the platform, the ring forming a portion of the ground plane and having a first disk-like portion positioned below the perimeter of the platform to contact the meshing, and a second disk-like portion with a surface arranged coplanar with the planar upper surface of the platform and spaced therefrom to facilitate movement of equipment under test on and off the platform, the ring having a vertical, cylindrical portion connecting the first disk-like portion to the second disk-like portion.

28. The electromagnetic testing apparatus of claim 26, further comprising:

a clamp positioned along the perimeter of the platform for forcibly holding a portion of the conductive meshing against a perimeter surface of the platform.

29. The electromagnetic testing apparatus of claim 28, further comprising an elongate member threaded through links of the chain mail to prevent slippage of the chain mail between the clamp and the perimeter surface of the platform.

* * * * *